(12) United States Patent
Park et al.

(10) Patent No.: US 7,569,401 B2
(45) Date of Patent: Aug. 4, 2009

(54) MAGNETIC RANDOM ACCESS MEMORY CELLS HAVING SPLIT SUBDIGIT LINES HAVING CLADDING LAYERS THEREON AND METHODS OF FABRICATING THE SAME

(75) Inventors: Jae-Hyun Park, Gyeonggi-do (KR); Hyeong-Jun Kim, Seoul (KR); Won-Cheol Jeong, Seoul (KR); Chang-Wook Jeong, Seoul (KR); Hong-sik Jeong, Gyeonggi-do (KR); Gi-Tae Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/048,082

(22) Filed: Mar. 13, 2008

(65) Prior Publication Data

US 2008/0160643 A1   Jul. 3, 2008

Related U.S. Application Data

(62) Division of application No. 11/077,669, filed on Mar. 11, 2005, now abandoned.

(30) Foreign Application Priority Data

| Mar. 19, 2004 | (KR) | .............. 10-2004-0019007 |
| Aug. 13, 2004 | (KR) | .............. 10-2004-0064030 |

(51) Int. Cl.
    *H01L 21/00* (2006.01)
(52) U.S. Cl. .................. 438/3; 438/241; 257/295; 257/E21.665; 365/97

(58) Field of Classification Search .............. 438/3, 438/241, 597; 257/295, E21.436, E21.665; 365/97, 158
    See application file for complete search history.

(56) References Cited

U.S. PATENT DOCUMENTS

| 6,430,084 | B1 | 8/2002 | Rizzo et al. ............... 365/173 |
| 6,475,812 | B2 | 11/2002 | Nickel et al. ............... 438/3 |
| 6,924,520 | B2 | 8/2005 | Park et al. ............... 257/295 |
| 6,943,420 | B2 | 9/2005 | Jeong ............... 257/422 |
| 6,992,342 | B2 * | 1/2006 | Motoyoshi et al. .......... 257/295 |
| 7,002,195 | B2 | 2/2006 | Park ............... 257/295 |

FOREIGN PATENT DOCUMENTS

JP          2002-176150          6/2002

* cited by examiner

*Primary Examiner*—Quoc D Hoang
(74) *Attorney, Agent, or Firm*—Myers Bigel Sibley & Sajovec, P.A.

(57) ABSTRACT

Magnetic RAM cells have split sub-digit lines surrounded by cladding layers and methods of fabricating the same are provided. The magnetic RAM cells include first and second sub-digit lines formed over a semiconductor substrate. Only a bottom surface and an outer sidewall of the first sub-digit line are covered with a first cladding layer pattern. In addition, only a bottom surface and an outer sidewall of the second sub-digit line are covered with a second cladding layer pattern. The outer sidewall of the first sub-digit line is located distal from the second sub-digit line and the outer sidewall of the second sub-digit line is located distal the first sub-digit line. Methods of fabricating the magnetic RAM cells are also provided.

14 Claims, 11 Drawing Sheets

MAGNETIC RANDOM ACCESS MEMORY CELLS HAVING SPLIT SUBDIGIT LINES HAVING CLADDING LAYERS THEREON AND METHODS OF FABRICATING THE SAME

CROSS-REFERENCE TO RELATED APPLICATION

This application is a divisional of application Ser. No. 11/077,669, filed Mar. 11, 2005 now abandoned and claims the benefit of Korean Patent Application Nos. 2004-0019007 and 2004-0064030, filed Mar. 19, 2004 and Aug. 13, 2004 respectively, the contents of which are hereby incorporated herein by reference in their entirety.

BACKGROUND OF THE INVENTION

The present invention relates to semiconductor memory cells and methods of fabricating the same and, more particularly, to magnetic random access memory cells and methods of fabricating the same.

Magnetic random access memory (MRAM) devices have been widely used as non-volatile memory devices, which can be operated at a low voltage and/or a high speed. In a unit cell of the MRAM devices, one bit of data is stored in a magnetic tunnel junction (MTJ) of a magnetic resistor. The MTJ generally includes first and second ferromagnetic layers and a tunneling insulation layer interposed between the first and second ferromagnetic layers. Magnetic polarization of the first ferromagnetic layer, which is also referred to as a free layer, can be changed by a magnetic field that crosses the MTJ. The magnetic field can be induced by a current that flows around the MTJ. The magnetic polarization of the free layer may be parallel or anti-parallel to the magnetic polarization of the second ferromagnetic layer, also referred to as a pinned layer. Current for generating the magnetic field flows through a conductive layer, which is referred to as a digit line, disposed around the MTJ.

According to spintronics based on quantum mechanics, in the event that magnetic spins in the free layer and the pinned layer are arrayed to be parallel with each other, a tunneling current flowing through the MTJ exhibits a maximum value. On the other hand, in the event that the magnetic spins in the free layer and the pinned layer are arrayed to be anti-parallel with each other, the tunneling current flowing through the MTJ has a minimum value. Thus, data of the MRAM cell may be determined according to the direction of the magnetic spins in the free layer.

FIG. 1 is a cross-sectional view illustrating a conventional MRAM cell. Referring to FIG. 1, a first interlayer insulating layer 3 is stacked on a semiconductor substrate 1. A digit line 5 is disposed on the first interlayer insulating layer 3. The digit line 5 and the first interlayer insulating layer 3 are covered with a second interlayer insulating layer 7. A magnetic resistor 16 is disposed on the second interlayer insulating layer 7 to overlap with a predetermined region of the digit line 5. he magnetic resistor 16 includes a lower electrode 11, a MTJ 13 and an upper electrode 15 which are sequentially stacked. The magnetic resistor 16 and the second interlayer insulating layer 7 are covered with a third interlayer insulating layer 17. A bit line 19, electrically connected to the upper electrode 15, is disposed on the third interlayer insulating layer 17.

The lower electrode 11 may be electrically connected to a predetermined region of the semiconductor substrate 1. Therefore, the lower electrode 11 may be formed to have a wider width than the digit line 5. That is to say, the lower electrode 11 may be formed to have an extension A that does not overlap with the digit line 5. The extension A is electrically connected to a predetermined region of the semiconductor substrate 1 through a lower electrode plug 9 that penetrates the first and second interlayer insulating layers 3 and 7.

As a result, the extension A of the lower electrode 11 makes it difficult to shrink the conventional MRAM cell shown in FIG. 1.

In recent years, an MRAM cell having split sub-digit lines has been proposed to solve the above-mentioned problems. In addition, a cladding layer surrounding a sidewall and a bottom surface of the digit lines is widely used so as to enhance a writing efficiency of the MRAM cell. An MRAM cell employing a cladding layer is discussed in U.S. Pat. No. 6,430,084 B1 to Rizzo et al., entitled "Magnetic Random Access Memory having Digit Lines and Bit Lines with a Ferromagnetic Cladding Layer."

FIG. 2 is a cross-sectional view illustrating an MRAM cell having the cladding layer, as disclosed in U.S. Pat. No. 6,430,084 B1, that surrounds the split sub-digit lines.

Referring to FIG. 2, a first interlayer insulating layer 23 is provided on a semiconductor substrate 21. First and second parallel split sub-digit lines 27a and 27b are disposed in the first interlayer insulating layer 23. Both sidewalls and a bottom surface of the first sub-digit line 27a are surrounded by a first cladding layer 25a, and both sidewalls and a bottom surface of the second sub-digit line 27b are also surrounded by a second cladding layer 25b. A second interlayer insulating layer 29 is provided on the semiconductor substrate having the first and second sub-digit lines 27a and 27b as well as the first and second cladding layers 25a and 25b. A predetermined region of the semiconductor substrate 21 is electrically connected to an MTJ contact plug 31 that penetrates the first and second interlayer insulating layers 23 and 29. The MTJ contact plug 31 passes through a region between the first and second sub-digit lines 27a and 27b. An MTJ 33 is disposed on the second interlayer insulating layer 29 to come into contact with the MTJ contact plug 31.

When a writing current is forced into the split sub-digit lines 27a and 27b in order to store a bit of data in the MRAM cell shown in FIG. 2, first and second magnetic fields 35a and 35b are generated. The first and second magnetic fields 35a and 35b are mainly distributed on one side and the other side of the MTJ 33 as shown in FIG. 2, respectively. In other words, it may be difficult to generate a magnetic field that is uniformly distributed throughout the MTJ 33 during the writing operation. This is because all sidewalls of the first and second sub-digit lines 27a and 27b are surrounded by the first and second cladding layers 25a and 25b. Thus, there is a limitation in improving the writing efficiency of the MRAM cell, even though the MRAM cell having the split sub-digit lines 27a and 27b employs the cladding layers that concentrate the magnetic fields.

SUMMARY OF THE INVENTION

Some embodiments of the present invention provide MRAM cells having split digit lines. The MRAM cells include first and second sub-digit lines that are formed on a semiconductor substrate and spaced apart from each other. Only a bottom surface of the first sub-digit line and an outer sidewall of the first sub-digit line located distal from the second sub-digit line are surrounded by a first cladding layer pattern. Also, only a bottom surface of the second sub-digit line and an outer sidewall of the second sub-digit line located distal from the first sub-digit line are surrounded by a second cladding layer pattern. A magnetic resistor contact plug penetrates a region between the first and second sub-digit lines. A magnetic resistor is disposed on the magnetic resistor contact plug. The magnetic resistor is electrically connected to the magnetic resistor contact plug.

In some embodiments, the first and second cladding layer patterns may include ferromagnetic layers.

In other embodiments, the magnetic resistor may include a pinning layer, a pinned layer, a tunneling insulation layer and a free layer, which are sequentially stacked.

In yet other embodiments, top surfaces of the first and second sub-digit lines may be covered with capping layers, and inner sidewalls of the first and second sub-digit lines may be covered with insulating spacers.

In still other embodiments, a bit line may be disposed on the magnetic resistor. The bit line may be electrically connected to the magnetic resistor and may cross over the first and second sub-digit lines.

In yet still other embodiments, the first and second sub-digit lines may be extended to be parallel with each other. Alternatively, the first and second sub-digit lines may be extended to come into contact with each other.

Some embodiments of the present invention provide methods of fabricating MRAM cells having split digit lines. In some embodiments, the methods include forming a first interlayer insulating layer on a semiconductor substrate and forming a groove in the first interlayer insulating layer. A cladding layer is formed on a bottom surface and sidewalls of the groove. A digit line is formed in a space surrounded by the cladding layer. The digit line and the cladding layer are patterned to form an opening that penetrates the digit line and the cladding layer. As a result, first and second cladding layer patterns are formed at both sides of the opening respectively, and first and second sub-digit lines are also formed at both sides of the opening respectively. A second interlayer insulating layer is formed on the semiconductor substrate having the first and second sub-digit lines. A magnetic resistor contact plug is formed to penetrate the first and second interlayer insulating layers. The magnetic resistor contact plug is formed to pass through a region between the first and second sub-digit lines. A magnetic resistor, electrically connected to the magnetic resistor contact plug, is formed on the second interlayer insulating layer.

In some embodiments, forming the cladding layer and the digit line may comprise sequentially forming a conformal cladding layer and a conductive layer filling the groove on the semiconductor substrate having the groove, and planarizing the conductive layer and the conformal cladding layer until a top surface of the first interlayer insulating layer is exposed. The conformal cladding layer may be formed of a ferromagnetic layer. In addition, planarization of the conductive layer and the conformal cladding layer may be carried out using a chemical mechanical polishing process.

In other embodiments, a capping layer may be formed on the semiconductor substrate having the digit line prior to formation of the first and second sub-digit lines. In this case, the capping layer is patterned during formation of the opening. In addition, an insulating spacer may be formed on the sidewall of the opening. The capping layer and the insulating spacer may be formed of an insulating layer having an etch selectivity with respect to the first and second interlayer insulating layers.

In yet other embodiments, an upper interlayer insulating layer may be formed on the semiconductor substrate having the magnetic resistor, and a bit line, electrically connected to the magnetic resistor, may be formed on the upper interlayer insulating layer. The bit line may be formed to cross over the sub-digit lines.

In still other embodiments, the opening may be formed to have a line configuration. Alternatively, the opening may be formed to have a hole shape.

Some embodiments of the present invention provide methods of fabricating MRAM cells include forming a first interlayer insulating layer on a semiconductor substrate and forming a groove in the first interlayer insulating layer. A conformal cladding layer is formed on the substrate having the groove. A separating wall is formed on a predetermined region of the cladding layer in the groove to divide at least a portion of the groove into first and second grooves. First and second digit lines are formed in the first and second grooves respectively, and a top surface of the first interlayer insulating layer is exposed during formation of the first and second digit lines. As a result, a cladding layer pattern covering only a bottom surface and sidewalls of the groove is formed. A capping layer is formed on the substrate having the sub-digit lines and the cladding layer pattern. An opening is formed to pass through a region between the first and second sub-digit lines. The opening is formed to penetrate the capping layer, the separating wall, and the cladding layer pattern. A spacer is formed on a sidewall of the opening. The first interlayer insulating layer is etched using the spacer as an etch mask to form a magnetic resistor contact hole exposing the semiconductor substrate.

In some embodiments, forming the separating wall may include forming a molding layer on the substrate having the cladding layer, planarizing the molding layer to form a molding layer pattern in the groove and to expose the cladding layer on the top surface of the first interlayer insulating layer, and patterning the molding layer pattern.

In other embodiments, the separating wall may be formed to have a line shape or an island shape. In the event that the separating wall is formed to have the line shape, the first and second grooves are defined to be parallel with each other. Alternatively, the first and second grooves may be connected to each other to thereby constitute a single merged groove when the separating wall is formed to have the island shape.

In yet other embodiments, forming the first and second sub-digit lines may include forming a conductive layer filling the first and second grooves on the substrate having the separating wall, and planarizing the conductive layer and the cladding layer to expose a top surface of the first interlayer insulating layer and a top surface of the separating wall. The conductive layer may be formed of a copper layer. The conductive layer and the cladding layer may be planarized using a chemical mechanical polishing process.

In still other embodiments, the capping layer and the spacer may be formed of an insulating layer having an etch selectivity with respect to the first interlayer insulating layer.

In further embodiments, a second interlayer insulating layer may be formed on the substrate having the space prior to formation of the magnetic resistor contact hole. In this case, the first and second interlayer insulating layers may be etched using the capping layer and the spacer as etch masks to thereby form the magnetic resistor contact hole.

In still further embodiments, a magnetic resistor contact plug may be formed in the magnetic resistor contact hole. In addition, a magnetic resistor, electrically connected to the magnetic resistor contact plug, may be formed on the substrate having the magnetic resistor contact plug. Furthermore, an upper interlayer insulating layer may be formed on the substrate having the magnetic resistor, and a bit line, electrically connected to the magnetic resistor, may be formed on the upper interlayer insulating layer. The bit line may be formed to cross over the sub-digit lines.

DETAILED DESCRIPTION OF THE INVENTION

Figure 1:
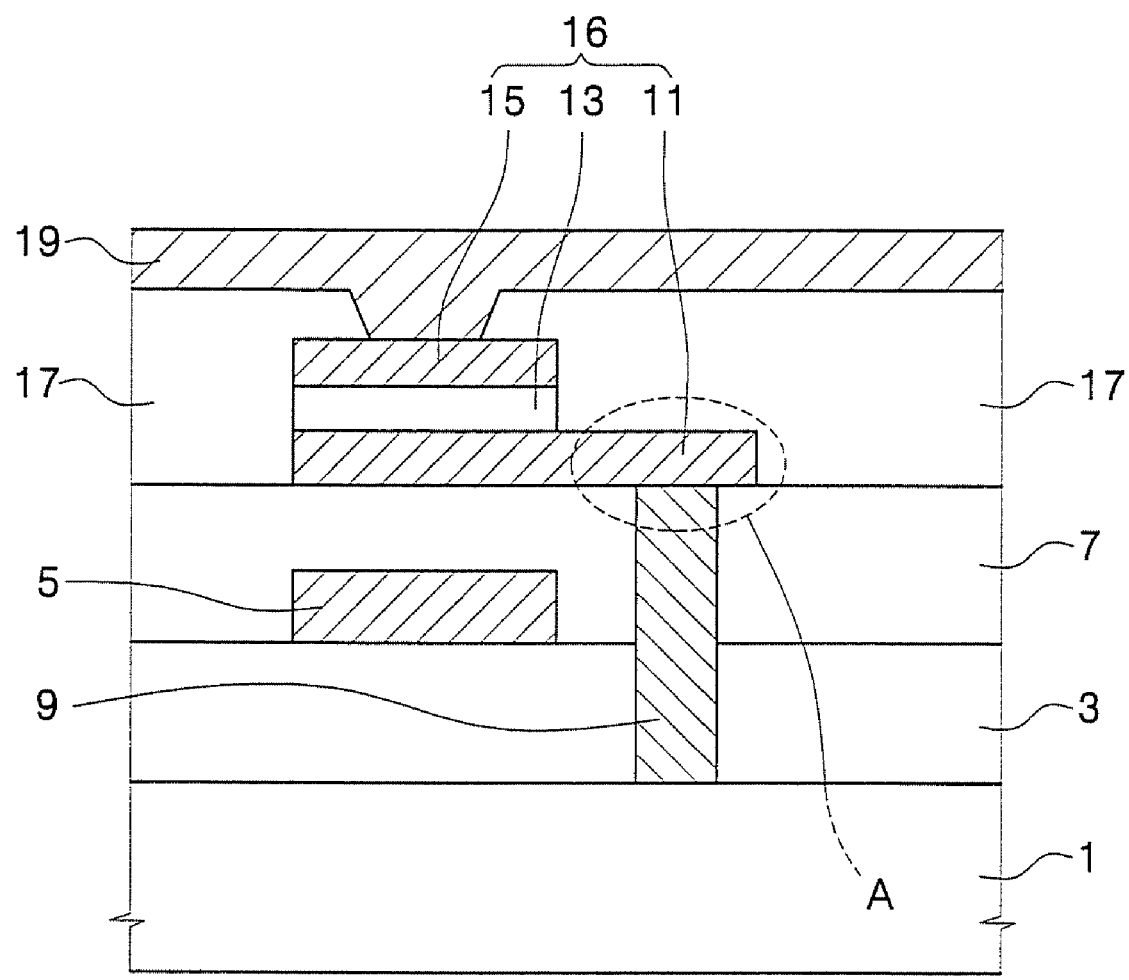
FIG. 1 is a cross-sectional view illustrating a conventional MRAM cell.
Figure 2:
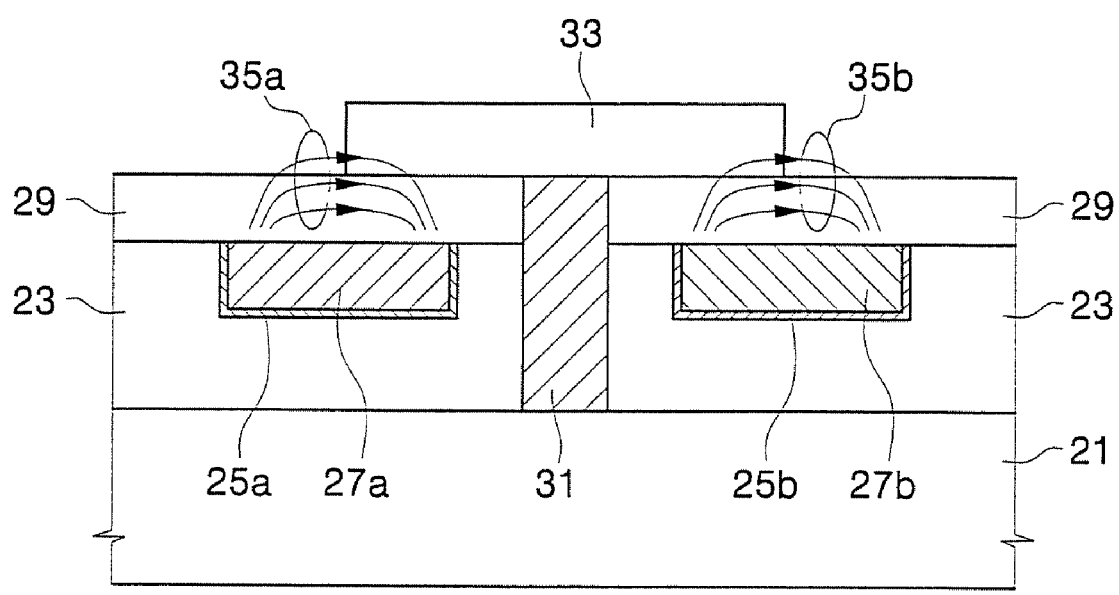
FIG. 2 is a cross-sectional view illustrating another conventional MRAM cell having split sub-digit lines.

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
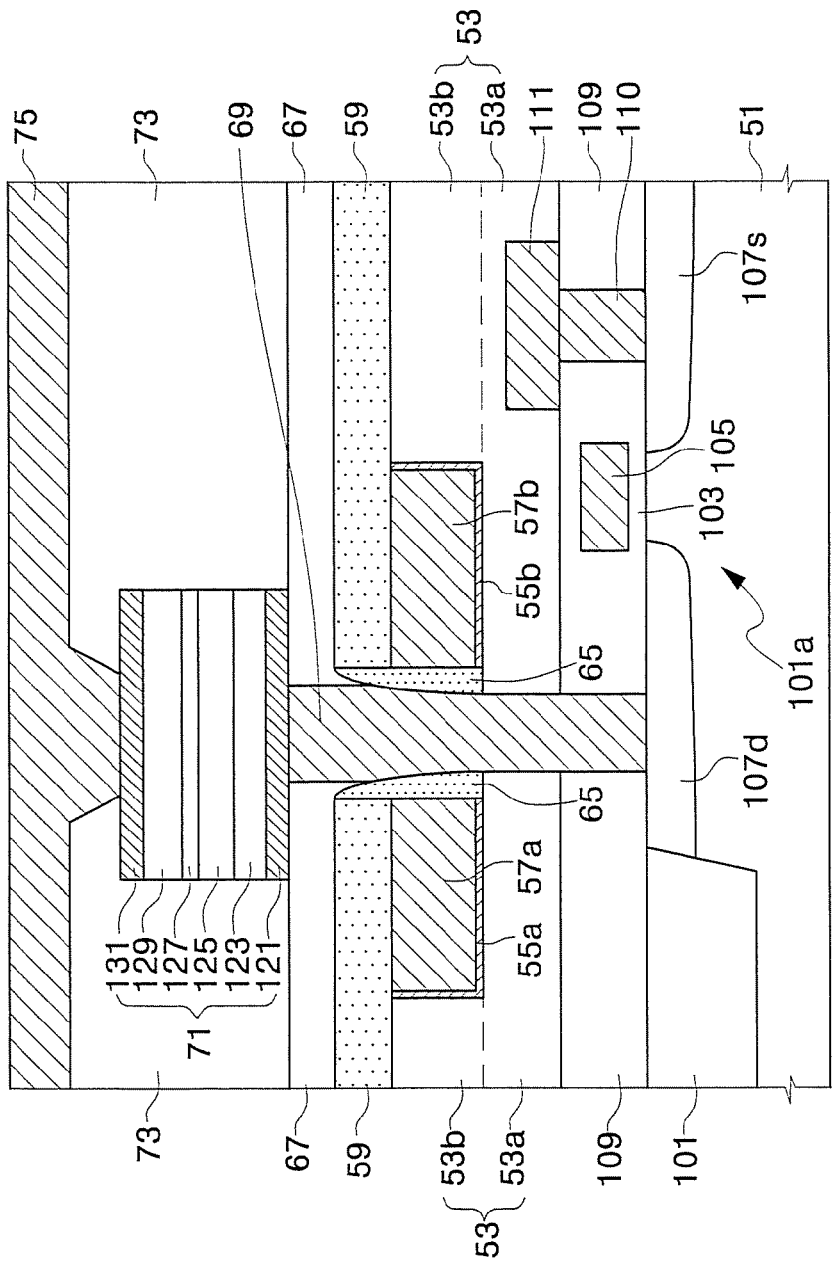
FIG. 3 is a cross-sectional view illustrating an MRAM cells in accordance with some embodiments of the present invention.

FIG. 3 is a cross-sectional view illustrating MRAM cells in accordance with some embodiments of the present invention.

Referring to FIG. 3, an isolation layer 101 is provided at a predetermined region of a semiconductor substrate 51. The isolation layer 101 defines an active region 101a. A source region 107s and a drain region 107d, spaced apart from each other, are provided in the active region 101a. A gate electrode 105 is disposed over a channel region between the source region 107s and the drain region 107d. The gate electrode 105 may extend to cross over the active region 101a, thereby acting as a word line. A gate insulating layer 103 is interposed between the gate electrode 105 and the channel region. The gate electrode 105, the source region 107s, and the drain region 107d constitute an access transistor.

A lower interlayer insulating layer 109 is provided on the semiconductor substrate having the access transistor. A common source line 111 is disposed on the lower interlayer insulating layer 109. The common source line 111 is electrically connected to the source region 107s through a common source line contact plug 110 that penetrates the lower interlayer insulating layer 109. The common source line 111 may be disposed to be parallel with the gate electrode 105.

The common source line 111 and the lower interlayer insulating layer 109 are covered with a first interlayer insulating layer 53. First and second sub-digit lines 57a and 57b are spaced apart from each other and disposed in the first interlayer insulating layer 53. A bottom surface and an outer sidewall of the first sub-digit line 57a are surrounded by a first cladding layer pattern 55a. The outer sidewall of the first sub-digit line 57a corresponds to a sidewall distal from the second sub-digit line 57b and an inner sidewall of the first sub-digit line 57a corresponds to a sidewall proximate the second sub-digit line 57b. Similarly, a bottom surface and an outer sidewall of the second sub-digit line 57b are surrounded with a second cladding layer pattern 55b. The first and second sub-digit lines 57a and 57b may be a conductive layer, such as a copper layer or an aluminum layer, and the first and second cladding layer patterns 55a and 55b may be a ferromagnetic layer, such as a nickel iron (NiFe) layer. The first and second cladding layer patterns 55a and 55b may act to concentrate magnetic flux generated by currents that flow through the first and second sub-digit lines 57a and 57b.

The first and second sub-digit lines 57a and 57b may be extended to come into contact with each other. In this case, a hole-shaped opening is provided between the first and second sub-digit lines 57a and 57b. Thus, a hole shaped opening is used herein to refer to an opening that is surrounded by the first and second sub-digit lines 57a and 57b. Alternatively, the first and second sub-digit lines 57a and 57b may be extended to be parallel with each other. In this case, a line-shaped opening is provided between the first and second sub-digit lines 57a and 57b. Thus, a line shaped opening is used herein to refer to an opening that is bordered by the first and second sub-digit lines 57a and 57b but not necessarily surrounded by the first and second sub-digit lines 57a and 57b.

The first interlayer insulating layer 53 may include a first lower interlayer insulating layer 53a and a first upper interlayer insulating layer 53b, which are sequentially stacked. In this case, the first and second cladding layer patterns 55a and 55b as well as the first and second sub-digit lines 57a and 57b may be provided in the first upper interlayer insulating layer 53b.

Top surfaces of the first and second sub-digit lines 57a and 57b may be covered with a capping layer 59. The capping layer 59 may extend to cover the first interlayer insulating layer 53. In addition, inner sidewalls of the first and second sub-digit lines 57a and 57b, namely, a sidewall of the opening between the first and second sub-digit lines 57a and 57b, may be covered with an insulating spacer 65. The insulating spacer 65 may be extended to cover a sidewall of the capping layer 59 on the first and second sub-digit lines 57a and 57b.

The semiconductor substrate having the capping layer 59 and the insulating spacer 65 is covered with a second interlayer insulating layer 67. In some embodiments, the capping layer 59 and the insulating spacer 65 are insulating layers having an etch selectivity with respect to at least the first and second interlayer insulating layers 53 and 67. For example, the capping layer 59 and the insulating spacer 65 may be silicon nitride layers when the first and second interlayer insulating layers 53 and 67 are silicon oxide layers. The drain region 107d is electrically connected to a magnetic resistor contact plug 69 that penetrates the first and second interlayer insulating layers 53 and 67 and the lower interlayer insulating layer 109. The magnetic resistor contact plug 69 passes through a region between the first and second sub-digit lines 57a and 57b. In this case, the magnetic resistor contact plug 69 may be self-aligned with the sub-digit lines 57a and 57b due to the presence of the capping layer 59 and the insulating spacer 65.

A magnetic resistor 71 covering the magnetic resistor contact plug 69 is provided on the second interlayer insulating layer 67. The magnetic resistor 71 may include a lower electrode 121, a pinning layer 123, a pinned layer 125, a tunneling insulation layer 127, a free layer 129 and an upper electrode 131 which are sequentially stacked. In this case, the lower electrode 121 is electrically connected to the magnetic resistor contact plug 69. The pinning layer 123 may be an antiferromagnetic layer, and the pinned layer 125 and the free layer 129 may be ferromagnetic layers. In addition, the tunneling insulation layer 127 may be an insulating layer, such as an aluminum oxide layer.

The magnetic resistor 71 and the second interlayer insulating layer 67 are covered with an upper interlayer insulating layer 73. A bit line 75 is provided on the upper interlayer insulating layer 73. The bit line 75 may be disposed to cross over the first and second sub-digit lines 57a and 57b. Also, the bit line 75 may be electrically connected to the upper electrode 131 through a bit line contact hole that penetrates the upper interlayer insulating layer 73.

FIGS. 4 to 10 are cross-sectional views for illustrating methods of fabricating MRAM cells, such as shown in FIG. 3, according to some embodiments of the present invention.

Figure 4:
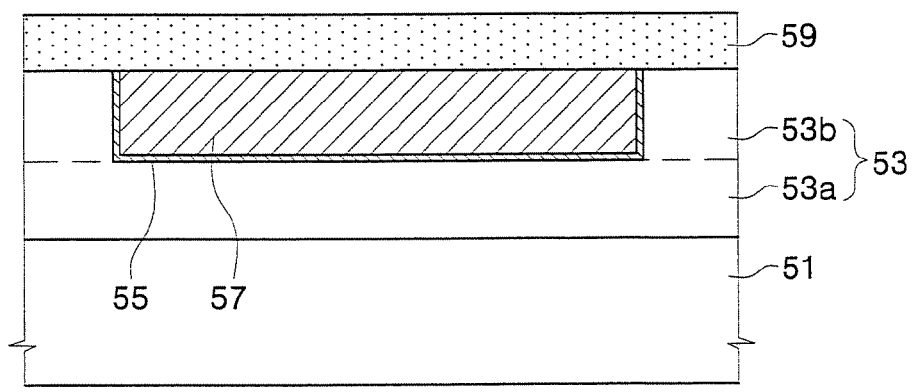
FIGS. 4 to 10 are cross-sectional views illustrating methods of fabricating MRAM cells in accordance with some embodiments of the present invention.

Referring to FIG. 4, a first interlayer insulating layer 53 is formed on a semiconductor substrate 51. An isolation layer (101 of FIG. 3), an access transistor, a lower interlayer insulating layer (109 of FIG. 3) and a common source line (111 of FIG. 3) may be formed at the semiconductor substrate 51 using conventional techniques prior to formation of the first interlayer insulating layer 53. Accordingly, fabrication of these portions of the structure of FIG. 3 will not be described in further detail herein.

The first interlayer insulating layer 53 is partially etched to form a groove. A conformal cladding layer and a conductive layer filling the groove are sequentially formed on the first interlayer insulating layer 53 having the groove. The conformal cladding layer may be formed of a ferromagnetic layer, such as a nickel iron (NiFe) layer, and the conductive layer may be formed of a metal layer, such as a copper layer or an aluminum layer. The conductive layer and the conformal cladding layer are then planarized to expose a top surface of the first interlayer insulating layer 53. As a result, a cladding layer pattern 55 covering a bottom surface and sidewalls of the groove as well as a digit line 57 surrounded by the cladding layer pattern 55 are formed. The planarization process may be carried out using a chemical mechanical polishing (CMP) process. Thus, the cladding layer pattern 55 is formed to cover a bottom surface and sidewalls of the digit line 57.

Furthermore, the first interlayer insulating layer 53 may be formed by sequentially stacking a first lower interlayer insulating layer 53a and a first upper interlayer insulating layer 53b. In some embodiments, the first upper interlayer insulating layer 53b is formed of an insulating layer having an etch selectivity with respect to the first lower interlayer insulating layer 53a, and the cladding layer pattern 55 and the digit line 57 may be formed in the first upper interlayer insulating layer 53b. In addition, a capping layer 59 may be formed on the semiconductor substrate having the cladding layer pattern 55 and the digit line 57. In some embodiments, the capping layer 59 is formed of an insulating layer having an etch selectivity with respect to the first interlayer insulating layer 53. For example, the capping layer 59 may be formed of a silicon nitride layer when the first interlayer insulating layer 53 is formed of a silicon oxide layer.

Figure 5:
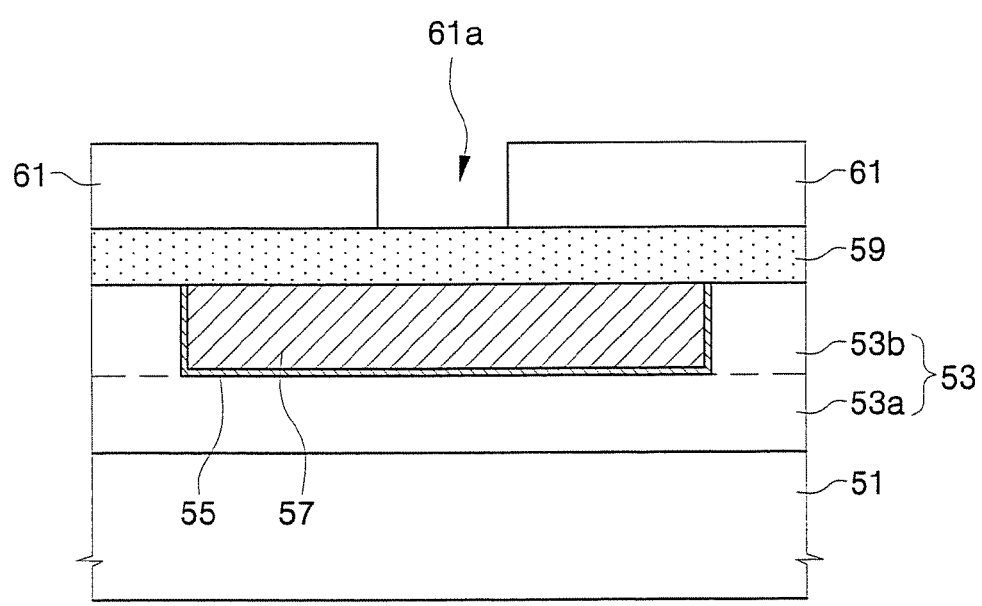

Referring to FIG. 5, a photoresist layer is formed on the capping layer 59. The photoresist layer is patterned using a photolithography process to form a photoresist pattern 61 having an opening 61a that exposes a portion of the capping layer 59. The opening 61a is disposed above the digit line 57. In addition, the opening 61a may be formed to have a line shape or a hole shape when viewed from a plan view.

Figure 6:
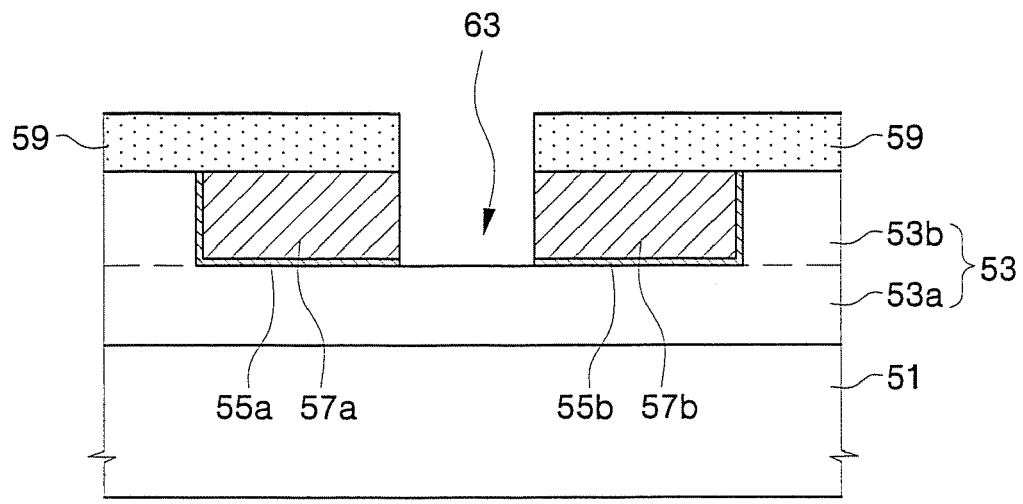

Referring to FIG. 6, the capping layer 59 is etched using the photoresist pattern 61 as an etch mask to expose a portion of the digit line 57. The photoresist pattern 61 is then removed, and the digit line 57 and the cladding layer pattern 55 are etched using the capping layer 59 as a hard mask to form an opening 63 that penetrates the digit line 57 and the cladding layer pattern 55. As a result, first and second sub-digit lines 57a and 57b are formed at both sides of the opening 63. In addition, a first cladding layer pattern 55a is formed to cover an outer sidewall and a bottom surface of the first sub-digit line 57a, and a second cladding layer pattern 55b is formed to cover an outer sidewall and a bottom surface of the second sub-digit line 57b. The outer sidewall of the first sub-digit line 57a corresponds to a sidewall opposite the second sub-digit line 57b, and the outer sidewall of the second sub-digit line 57b corresponds to a sidewall opposite the first sub-digit line 57a. That is, as shown in FIG. 6, no cladding layers are formed on inner sidewalls of the first and second sub-digit lines 57a and 57b, which are exposed by the opening 63.

When the opening 61a of the photoresist pattern 61 shown in FIG. 5 is formed to have a line shape, the opening 63 is also formed to have a line shape. In this case, the first and second sub-digit lines 57a and 57b are formed to be parallel with each other. Alternatively, when the opening 61a is formed to have a hole shape, the opening 63 is also formed to have a hole shape. In this case, extensions of the first and second sub-digit lines 57a and 57b are connected to each other and surround the hole to thereby provide a merged digit line.

The opening 63 may also be formed by successively etching the capping layer 59, the digit line 57 and the cladding layer pattern 55 using the photoresist pattern 61 shown in FIG. 5 as an etch mask. In this case, the photoresist pattern 61 is removed after formation of the opening 63.

Figure 7:
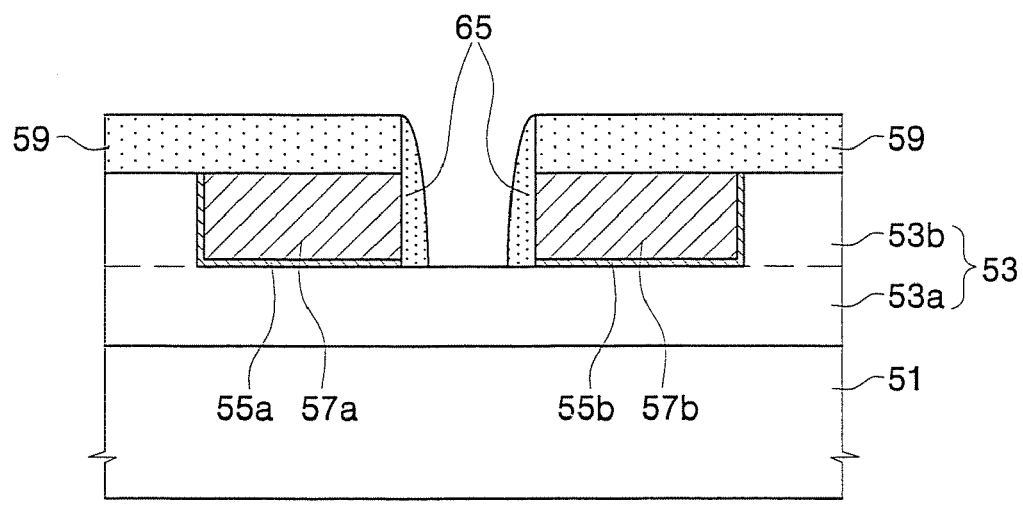

Referring to FIG. 7, an insulating spacer 65 may be formed on a sidewall of the opening 63, e.g., inner walls of the first and second sub-digit lines 57a and 57b using a conventional method. The insulating spacer 65 may be formed to substantially cover the sidewall of the capping layer 59 as well as the inner sidewalls of the sub-digit lines 57a and 57b. The insulating spacer 65 may be formed of the same material as the capping layer 59.

Figure 8:
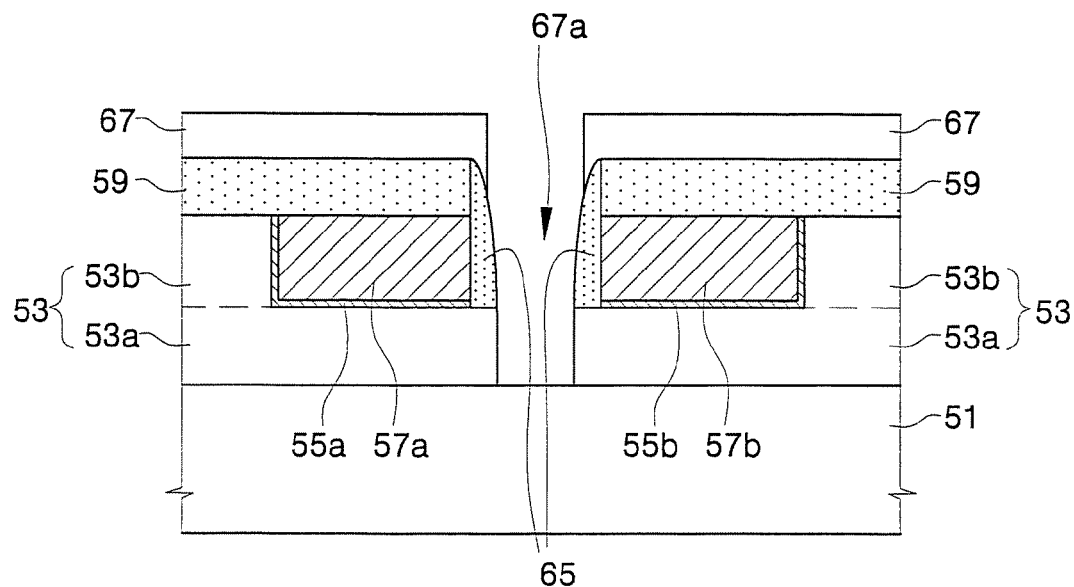

Referring to FIG. 8, a second interlayer insulating layer 67 may be formed on the semiconductor substrate having the insulating spacer 65. The second interlayer insulating layer 67 may be formed of the same material as the first interlayer insulating layer 53. Accordingly, in some embodiments, the capping layer 59 and the insulating spacer 65 may have an etch selectivity with respect to the first and second interlayer insulating layers 53 and 67. The first and second interlayer insulating layers 53 and 67 are then patterned using an etching process to form a magnetic resistor contact hole 67a that passes through a region between the first and second sub-digit lines 57a and 57b. When the access transistor and the lower interlayer insulating layer 109 are formed on the semiconductor substrate as shown in FIG. 3, the magnetic resistor contact hole 67a extends to penetrate the lower interlayer insulating layer 109 and to expose a drain region (107d of FIG. 3) of the access transistor.

The capping layer 59 and the spacer 65 act as etch stop layers during formation of the magnetic resistor contact hole 67a. Accordingly, the magnetic resistor contact hole 67a may be self-aligned with the first and second sub-digit lines 57a and 57b.

Figure 9:
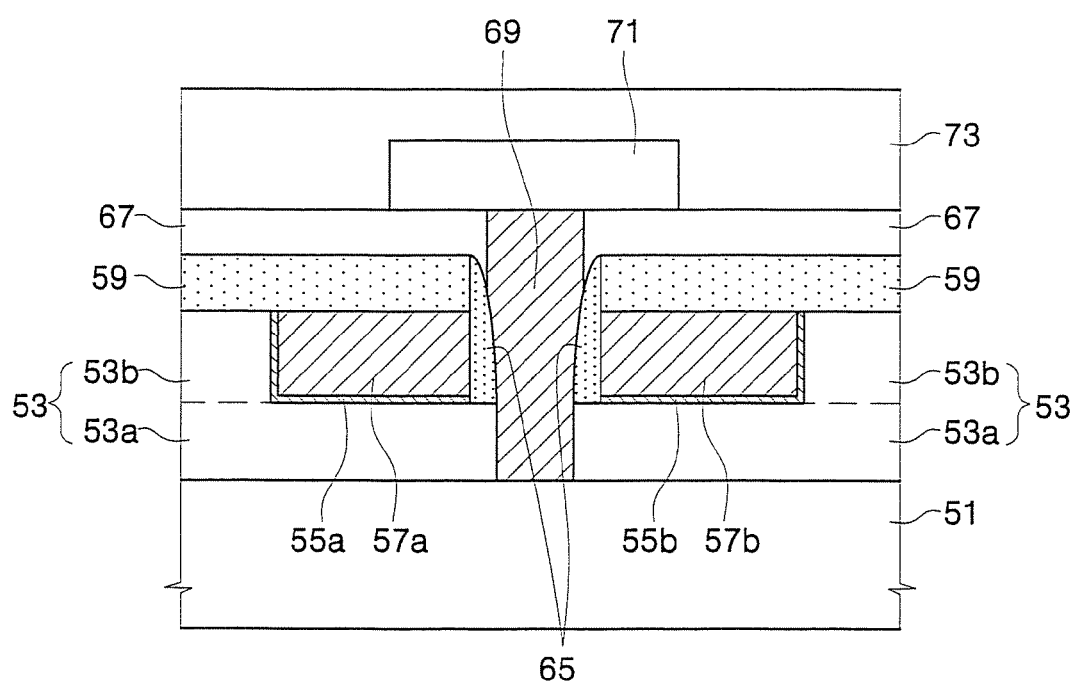

Referring to FIG. 9, a magnetic resistor contact plug 69 may be formed in the magnetic resistor contact hole 67a using a conventional method. A magnetic resistor 71 is formed on the second interlayer insulating layer 67 to cover the magnetic resistor contact plug 69. The magnetic resistor 71 may be formed by sequentially stacking a lower electrode layer, a pinning layer, a pinned layer, a tunneling insulation layer, a free layer and an upper electrode, and by patterning the upper electrode layer, the free layer, the tunneling insulation layer, the pinned layer, the pinning layer and the lower electrode layer. The pinning layer is formed of an anti-ferromagnetic layer, and the pinned layer and the free layer are formed of ferromagnetic layers. An upper interlayer insulating layer 73 is then formed on the semiconductor substrate having the magnetic resistor 71.

Figure 10:
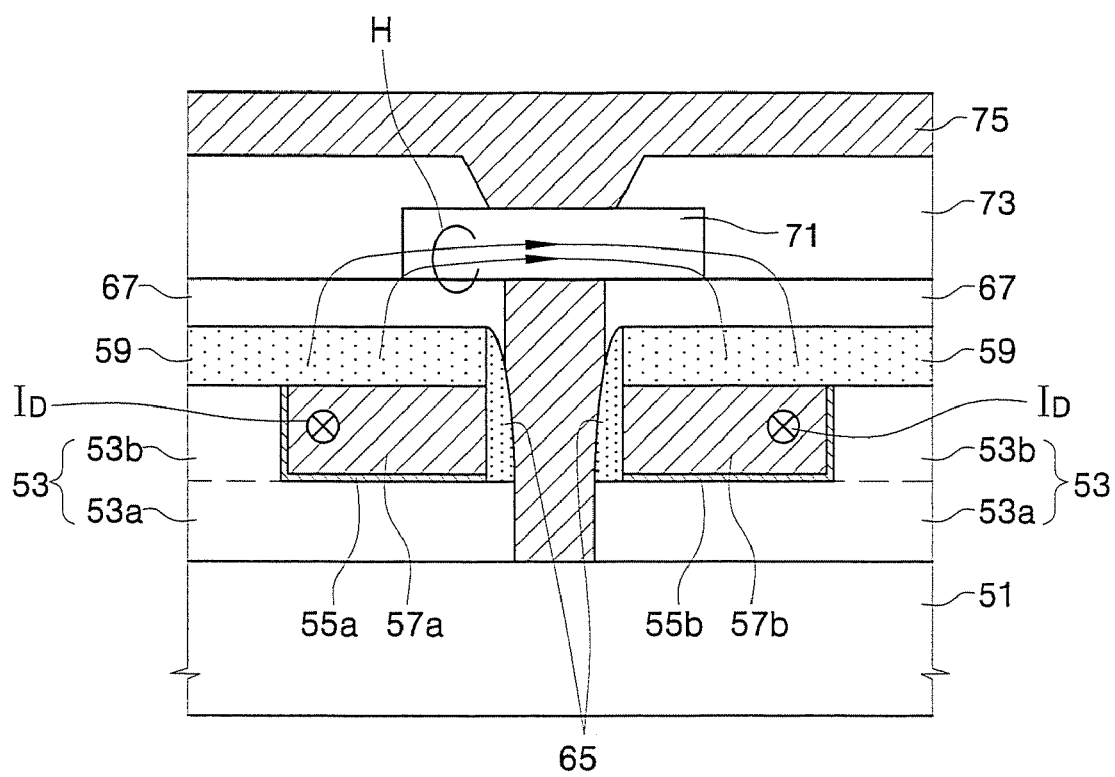

Referring to FIG. 10, the upper interlayer insulating layer 73 is patterned to form a bit line contact hole that exposes the magnetic resistor 71. A conductive layer, such as a metal layer, is formed on the semiconductor substrate having the bit line contact hole, and the conductive layer is patterned to form a bit line 75 that covers the bit line contact hole and crosses over the sub-digit lines 57a and 57b. As a result, the bit line 75 is electrically connected to the magnetic resistor 71 through the bit line contact hole.

When the digit line 57 is formed of a copper layer, it may be difficult to pattern the digit line 57 using the typical photolithography/etching process described with reference to FIGS. 5 and 6.

FIGS. 11 to 17 are cross-sectional views illustrating methods of fabricating MRAM cells according to some embodiments of the present invention, which may be particularly suitable for forming the first and second sub-digit lines 57a and 57b with copper layers.

Figure 11:
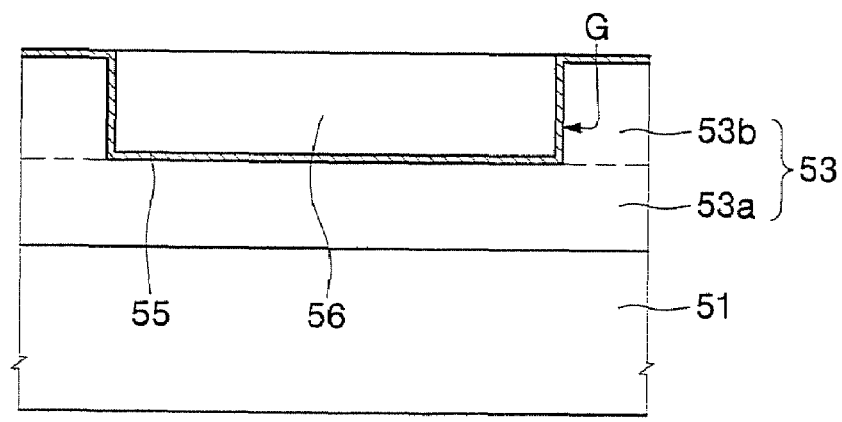
FIGS. 11 to 17 are cross-sectional views illustrating methods of fabricating MRAM cells in accordance with other embodiments of the present invention.

Referring to FIG. 11, a first interlayer insulating layer 53 is formed on a semiconductor substrate 51. An isolation layer 101, an access transistor, a lower interlayer insulating layer 109 and a common source line 111 as shown in FIG. 3 may be formed at the semiconductor substrate 51 using conventional methods prior to formation of the first interlayer insulating layer 53.

The first interlayer insulating layer 53 is partially etched to form a groove G. A conformal cladding layer 55 is formed on the first interlayer insulating layer 53 having the groove G and a molding layer filling the groove G is formed on the cladding layer 55. The conformal cladding layer 55 may be formed of a ferromagnetic layer, and the molding layer may be formed of a material layer having an etch selectivity with respect to the cladding layer 55. For example, when the cladding layer 55 is formed of a NiFe layer, the molding layer may be formed of a silicon oxide layer, a silicon nitride layer and/or a silicon oxynitride layer. The molding layer is planarized until the cladding layer 55 on a top surface of the first interlayer insulating layer 53 is exposed, to thereby form a molding layer pattern 56 within the groove G. Planarization of the molding layer may be carried out using an etchback process or a chemical mechanical polishing process.

The first interlayer insulating layer 53 may be formed using the same methods as those described with reference to FIG. 4.

Figure 12:
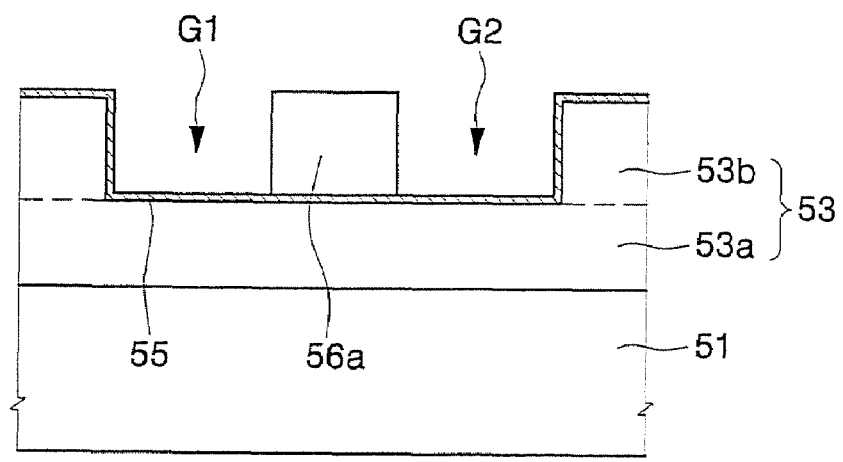
Figure 13:
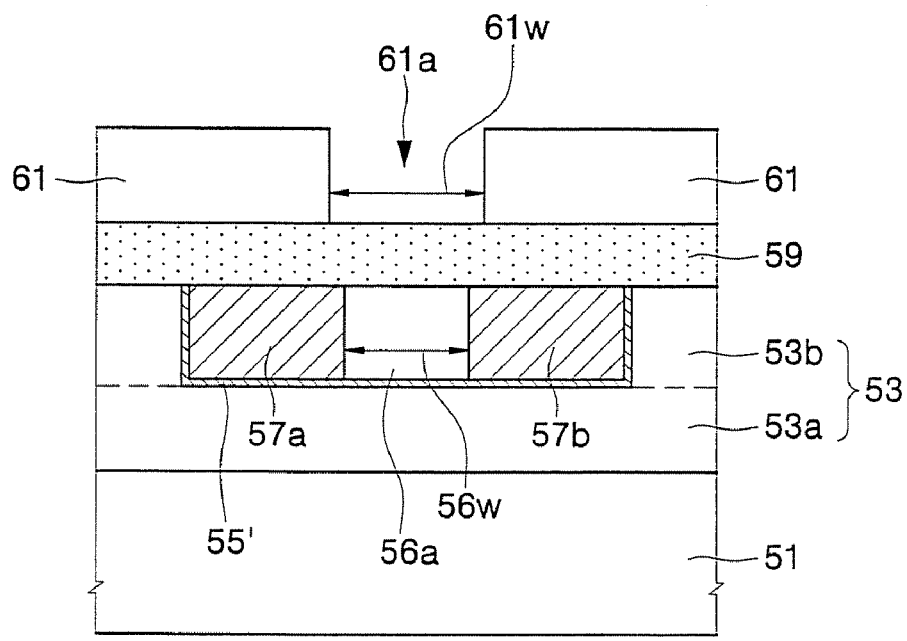

Referring to FIGS. 12 and 13, the molding layer pattern 56 is patterned to form a separating wall 56a dividing at least a portion of the groove G into first and second grooves G1 and G2. When the separating wall 56a is formed to have a line shape, the first and second grooves G1 and G2 may be parallel with each other. Alternatively, when the separating wall 56a is formed to have an island shape, the first and second grooves G1 and G2 may be connected to each other beyond the separating wall 56a to thereby form a merged groove.

A conductive layer filling the first and second grooves G1 and G2 is formed on the substrate having the separating wall 56a. The conductive layer may be formed of a metal layer, such as a copper layer and/or an aluminum layer. These embodiments may be suitable for the case that the conductive layer is formed of a metal layer, which typically cannot be easily patterned using a conventional photolithography/etching process. In other words, these embodiments may be suitable for the case that the conductive layer is formed of a metal layer, which should be patterned using a damascene technique. For example, these embodiments may be particularly well suited when the conductive layer is formed of a copper layer.

The conductive layer and the cladding layer 55 are planarized to expose a top surface of the first interlayer insulating layer 53 and a top surface of the separating wall 56a. When the conductive layer is formed of a copper layer as described above, the conductive layer and the cladding layer 55 may be planarized using a chemical mechanical polishing process. As a result, a cladding layer pattern 55' is formed to cover a bottom surface and sidewalls of the groove G, and first and second sub-digit lines 57a and 57b are formed in the first and second grooves G1 and G2 respectively. When the separating wall 56a has a line shape as described above, the first and second sub-digit lines 57a and 57b may be formed to be parallel with each other. Alternatively, when the separating wall 56a has an island shape as described above, the first and second sub-digit lines 57a and 57b may be connected to each other beyond the separating wall 56a to thereby form a merged digit line.

Subsequently, a capping layer 59 may be formed on the substrate having the first and second sub-digit lines 57a and 57b. The capping layer 59 is preferably formed of an insulating layer having an etch selectivity with respect to the first interlayer insulating layer 53. For example, when the first interlayer insulating layer 53 is formed of a silicon oxide layer, the capping layer 59 may be formed of a silicon nitride layer or a silicon oxynitride layer. Alternatively, when the first interlayer insulating layer 53 is formed by sequentially stacking the first lower interlayer insulating layer 53a and the first upper interlayer insulating layer 53b as described above, the capping layer 59 may be formed of an insulating layer having an etch selectivity with respect to at least the first lower interlayer insulating layer 53a.

A photoresist pattern 61 is formed on the capping layer 59. The photoresist pattern 61 is formed to have an opening 61a exposing a portion of the capping layer 59. The opening 61a is positioned above the separating wall 56a and may have a hole shape. A width 61w of the opening 61a may be equal to or greater than a width 56w of the separating wall 56a. Alternatively, the width 61w of the opening 61a may be less than the width 56w of the separating wall 56a.

Figure 14:
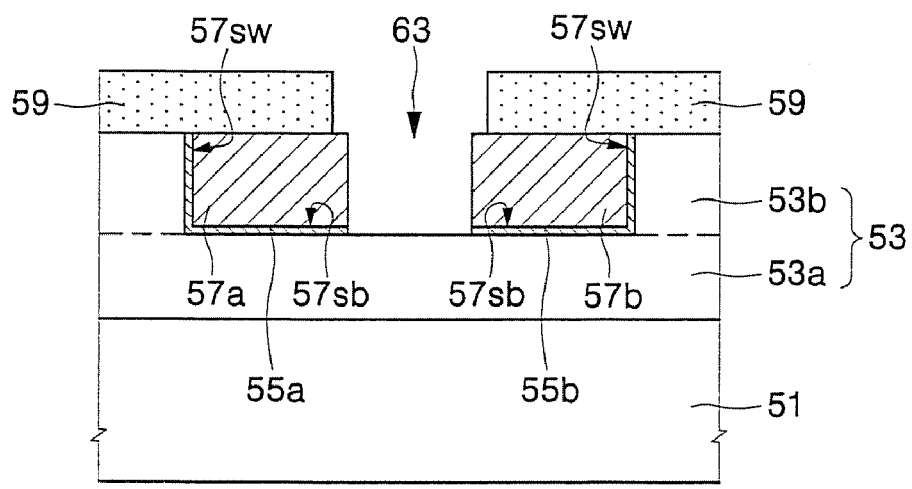

Referring to FIG. 14, the capping layer 59, the separating wall 56a and the cladding layer pattern 55' are etched using the photoresist pattern 61 as an etch mask to form an opening 63 passing through a region between the sub-digit lines 57a and 57b. As a result, a first cladding layer pattern 55a is formed to cover only an outer sidewall 57sw and a bottom surface 57sb of the first sub-digit line 57a, and a second cladding layer pattern 55b is formed to cover only an outer sidewall 57sw and a bottom surface 57sb of the second sub-digit line 57b. That is, no cladding layers are formed on inner sidewalls of the first and second sub-digit lines 57a and 57b. When the width 61w of the opening 61a of the photoresist pattern 61 is greater than the width 56w of the separating wall 56a, the sub-digit lines 57a and 57b may act as etch stop layers during formation of the opening 63. The photoresist pattern 61 is then removed.

Figure 15:
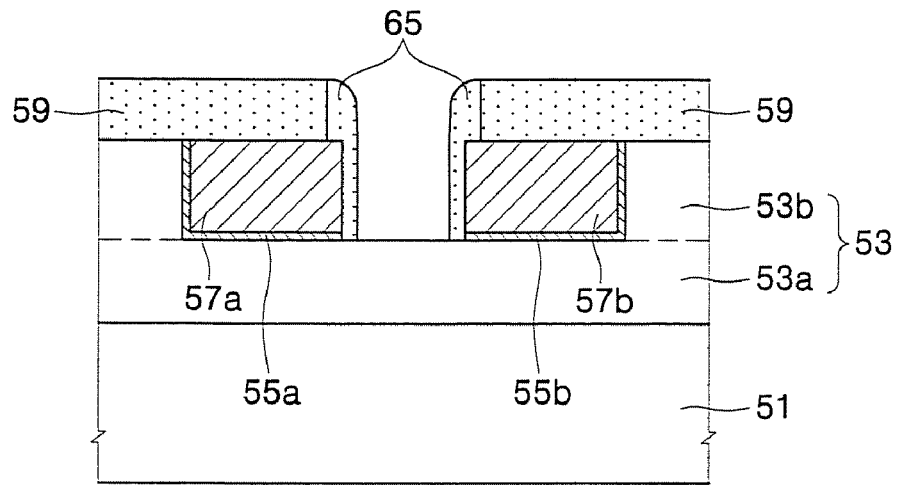

Referring to FIG. 15, an insulating spacer layer is formed on the substrate where the photoresist pattern 61 is removed, and the insulating spacer layer is anisotropically etched to form an insulating spacer 65 covering a sidewall of the opening 63. In some embodiments, the insulating spacer layer is formed of an insulating layer having an etch selectivity with respect to the first interlayer insulating layer 53. For example, when the first interlayer insulating layer 53 is formed of a silicon oxide layer, the insulating spacer layer may be formed of a silicon nitride layer or a silicon oxynitride layer. Alternatively, when the first interlayer insulating layer 53 is formed by sequentially stacking the first lower interlayer insulating layer 53a and the first upper interlayer insulating layer 53b as described above, the insulating spacer layer may be formed of an insulating layer having an etch selectivity with respect to at least the first lower interlayer insulating layer 53a. The insulating spacer 65 is formed to cover inner sidewalls of the first and second cladding layer patterns 55a and 55b and inner sidewalls of the first and second sub-digit lines 57a and 57b.

Figure 16:
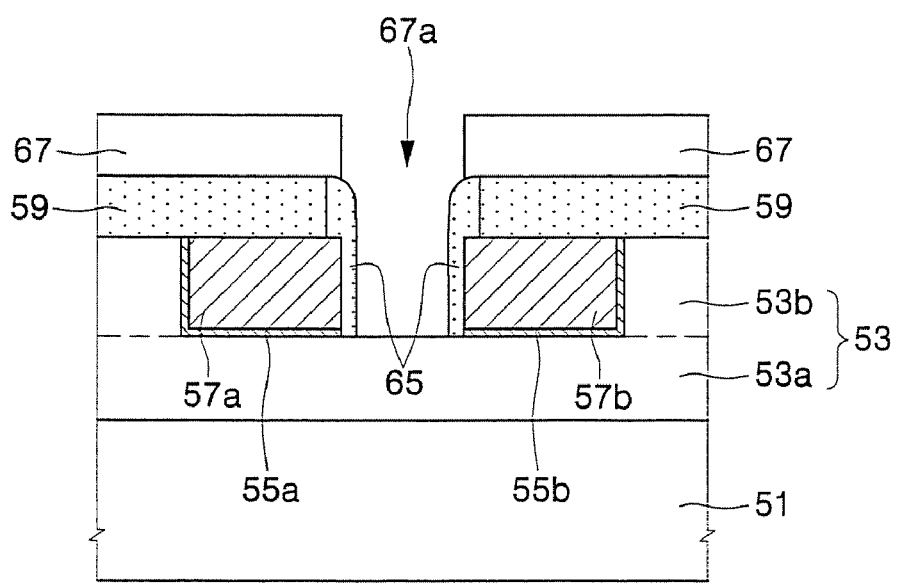

Referring to FIG. 16, a second interlayer insulating layer 67 may be formed on the substrate having the insulating spacer 65. The second interlayer insulating layer 67 may be formed of the same material as the first interlayer insulating layer 53. Accordingly, the capping layer 59 and the insulating spacer 65 may have an etch selectivity with respect to the first and second interlayer insulating layer 53 and 67. The first and second interlayer insulating layers 53 and 67 are patterned using, for example, an etching process to form a magnetic resistor contact hole 67a passing through a region between the first and second sub-digit lines 57a and 57b. When the access transistor and the lower interlayer insulating layer 109 are formed on the semiconductor substrate as shown in FIG. 3, the magnetic resistor contact hole 67a is formed to penetrate the lower interlayer insulating layer 109 and to expose a drain region (107d of FIG. 3) of the access transistor.

The capping layer 59 and the insulating spacer 65 may act as etch stop layers during formation of the magnetic resistor contact hole 67a. Accordingly, the magnetic resistor contact hole 67a may be self-aligned with the first and second sub-digit lines 57a and 57b.

Figure 17:
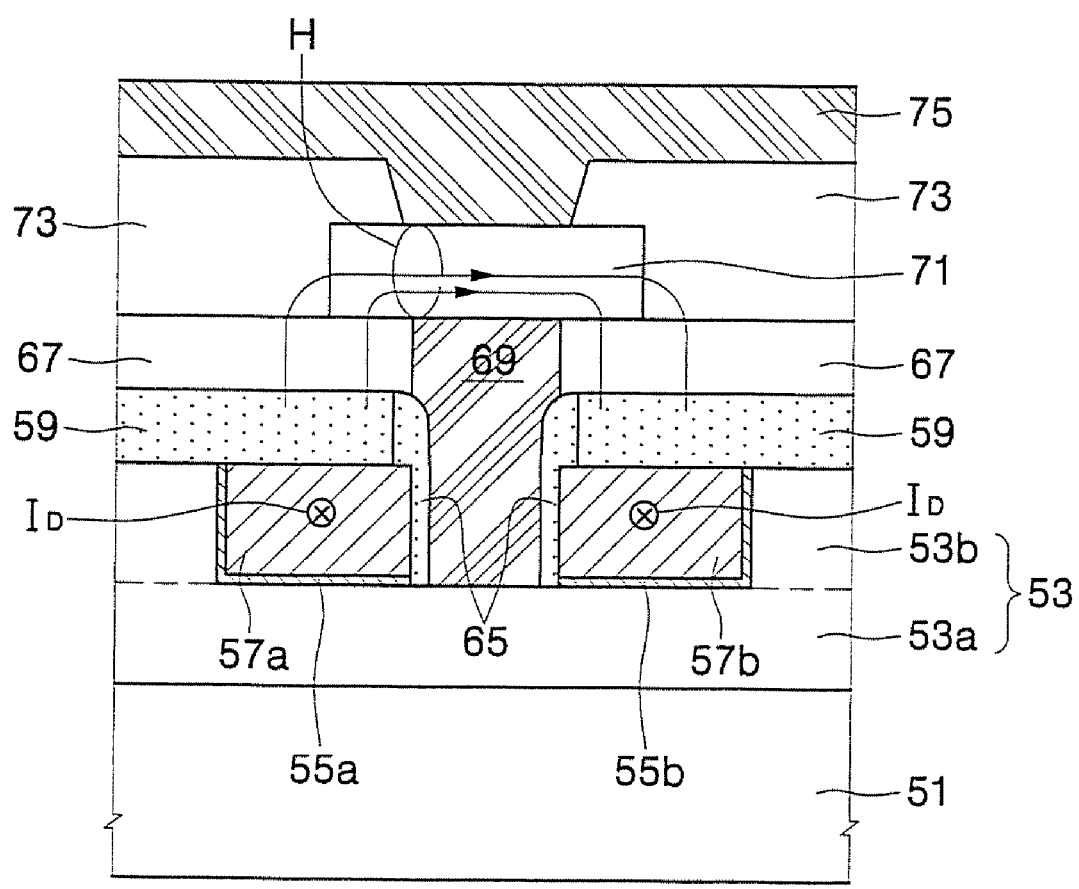

Referring to FIG. 17, a magnetic resistor contact plug 69 may be formed in the magnetic resistor contact hole 67a using a conventional method. A magnetic resistor 71 covering the magnetic resistor contact plug 69 is formed on the second interlayer insulating layer 67. The magnetic resistor 71 may be formed using the same methods as those described with reference to FIG. 9. An upper interlayer insulating layer 73 is formed on the semiconductor substrate having the magnetic resistor 71.

The upper interlayer insulating layer 73 is patterned to form a bit line contact hole that exposes the magnetic resistor 71. A conductive layer such as a metal layer is formed on the semiconductor substrate having the bit line contact hole, and the conductive layer is patterned to form a bit line 75 covering the bit line contact hole and crossing over the sub-digit lines 57a and 57b. As a result, the bit line 75 is electrically connected to the magnetic resistor 71 through the bit line contact hole.

As mentioned above, the first and second cladding layer patterns 55a and 55b of the MRAM cell according to some embodiments of the present invention are formed to cover only outer sidewalls and bottom surfaces of the first and second sub-digit lines 57a and 57b. Accordingly, when the writing current ($I_D$ of FIGS. 10 and 17) is applied to the sub-digit lines 57a and 57b, a magnetic field H may be uniformly generated along a direction, which is parallel to the bit line, throughout the magnetic resistor 71. This is because the cladding layer patterns 55a and 55b are not formed on the inner sidewalls of the sub-digit lines 57a and 57b. Accordingly, the MRAM cell according to some embodiments of the present invention may exhibit improved writing efficiency as compared to the conventional art. In addition, the sub-digit lines 57*a* and 57*b* may be patterned using a damascene technique that employs a chemical mechanical polishing process. Accordingly, the present invention provides methods of fabricating the MRAM cell, which are suitable for forming the sub-digit lines 57*a* and 57*b* with copper layers.

Embodiments of the present invention have been described herein with reference to cross-sectional illustrations. Thus, a continuous layer may appears as multiple layers in cross-section. For example, as described above, the first and second cladding patterns 55*a* and 55*b* and sub-digit lines 57*a* and 57*b* may be provided as continuous cladding layer 55 and sub digit line 57 that provides two regions in cross-section. Accordingly, in some embodiments of the present invention where the groove is provided as a hole or the mold pattern is provided as an island, the first and second sub-digit lines may comprise a single digit line and the first and second cladding layer patterns may comprise a single cladding layer.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of fabricating a magnetic random access memory (MRAM) cell, comprising:
   forming a first interlayer insulating layer on a semiconductor substrate;
   forming a groove in the first interlayer insulating layer;
   forming a conformal cladding layer on the substrate having the groove;
   forming a separating wall on a predetermined region of the cladding layer in the groove to divide at least a portion of the grove into first and second grooves;
   forming first and second sub-digit lines filling the first and second grooves respectively;
   selectively removing the cladding layer on a top surface of the first interlayer insulating layer to form a cladding layer pattern covering only a bottom surface and sidewalls of the groove;
   forming a capping layer on the substrate having the sub-digit lines and the cladding layer pattern;
   forming an opening penetrating the capping layer, the separating wall and the cladding layer pattern to pass through a region between the first and second sub-digit lines;
   forming a spacer covering a sidewall of the opening; and
   etching the first interlayer insulating layer using the spacer as an etch mask to form a magnetic resistor contact hole exposing the semiconductor substrate.

2. The method as recited in claim 1, wherein the groove is formed by partially etching the first interlayer insulating layer.

3. The method as recited in claim 1, wherein the cladding layer comprises a ferromagnetic layer.

4. The method as recited in claim 1, wherein forming the separating wall comprises:
   forming a molding layer on the substrate having the cladding layer;
   planarizing the molding layer to form a molding layer pattern in the groove and to expose the cladding g layer on the top surface of the first interlayer insulating layer; and patterning the molding lager pattern.

5. The method as recited in claim 1, wherein the separating wall is formed to have a line shape or an island shape.

6. The method as recited in claim 5, wherein the first and second grooves are defined to be parallel with each other when the separating wall is formed to have the line shape.

7. The method as recited in claim 5, wherein the first and second grooves are connected to each other to form a single merged groove when the separating wall is formed to have the island shape and the first and second sub-digit lines comprise a single digit line and the first and second cladding layer patterns comprise a single cladding layer pattern.

8. The method as recited in claim 1, wherein forming the first and second sub-digit lines comprises:
   forming a conductive layer filling the first and second grooves on the substrate having the separating wall; and
   planarizing the conductive layer and the cladding layer to expose the top surface of the first interlayer insulating layer and a top surface of the separating wall.

9. The method as recited in claim 8, wherein the conductive layer comprises a copper layer.

10. The method as recited in claim 8, wherein the conductive layer and the cladding layer are planarized using a chemical mechanical polishing (CMP) process.

11. The method as recited in claim 1, wherein the capping layer and the spacer comprise insulating layers having an etch selectivity with respect to the first interlayer insulating layer.

12. The method as recited in claim 1, further comprising forming a second interlayer insulating layer on the substrate having the spacer prior to formation of the magnetic resistor contact hole, wherein the magnetic resistor contact hole is formed by etching the first and second interlayer insulating layers using the capping layer and the spacer as etch masks.

13. The method as recited in claim 1, further comprising:
   forming a magnetic resistor contact plug filling the magnetic resistor contact hole; and
   forming a magnetic resistor electrically connected to the magnetic resistor contact plug over the capping layer.

14. The method as recited in claim 13, further comprising:
   forming an upper interlayer insulating layer on the substrate having the magnetic resistor; and
   forming a bit line electrically connected to the magnetic resistor on the upper interlayer insulating layer, wherein the bit line is formed to cross over the sub-digit lines.

* * * * *